(12) United States Patent
Fukatsu et al.

(10) Patent No.: US 10,892,332 B2
(45) Date of Patent: Jan. 12, 2021

(54) GATE INSULATING LAYER HAVING A PLURALITY OF SILICON OXIDE LAYER WITH VARYING THICKNESS

(71) Applicants: Kabushiki Kaisha Toshiba, Tokyo (JP); Toshiba Electronic Devices & Storage Corporation, Tokyo (JP)

(72) Inventors: Shigeto Fukatsu, Himeji Hyogo (JP); Masaru Furukawa, Himeji Hyogo (JP); Hiroshi Kono, Himeji Hyogo (JP); Takuma Suzuki, Himeji Hyogo (JP); Shunsuke Asaba, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/558,958

(22) Filed: Sep. 3, 2019

(65) Prior Publication Data

US 2020/0295140 A1 Sep. 17, 2020

(30) Foreign Application Priority Data

Mar. 15, 2019 (JP) .................................. 2019-049192

(51) Int. Cl.
*H01L 31/0256* (2006.01)
*H01L 21/02* (2006.01)
(Continued)

(52) U.S. Cl.
CPC ...... *H01L 29/1608* (2013.01); *H01L 21/7602* (2013.01); *H01L 29/513* (2013.01);
(Continued)

(58) Field of Classification Search
CPC .............. H01L 29/1608; H01L 29/513; H01L 29/7802; H01L 29/66053; H01L 51/0529; H01L 21/7602
See application file for complete search history.

(56) References Cited

U.S. PATENT DOCUMENTS 7,816,688 B2   10/2010   Yamashita et al.
9,318,558 B2    4/2016   Mine et al.
(Continued)

FOREIGN PATENT DOCUMENTS

JP        4647211 B2    3/2011
JP    2014-222735 A    11/2014
JP        5875684 B2    3/2016

*Primary Examiner* — Alonzo Chambliss
(74) *Attorney, Agent, or Firm* — White & Case LLP

(57) ABSTRACT

A semiconductor device according to an embodiment includes a silicon carbide layer; a gate electrode; and a gate insulating layer which is provided between the silicon carbide layer and the gate electrode and includes a first silicon oxide layer and a second silicon oxide layer provided between the first silicon oxide layer and the gate electrode, the first silicon oxide layer having a first nitrogen concentration and a first thickness, the second silicon oxide layer having a second nitrogen concentration lower than the first nitrogen concentration and a second thickness. The second thickness between an end portion of the gate electrode and the silicon carbide layer is greater than the second thickness between a central portion of the gate electrode and the silicon carbide layer.

11 Claims, 3 Drawing Sheets

(51) Int. Cl.
    *H01L 21/00*     (2006.01)
    *H01L 21/336*     (2006.01)
    *H01L 29/16*     (2006.01)
    *H01L 29/78*     (2006.01)
    *H01L 29/51*     (2006.01)
    *H01L 21/76*     (2006.01)
    *H01L 29/66*     (2006.01)
    *H01L 51/05*     (2006.01)

(52) U.S. Cl.
    CPC .... *H01L 29/66053* (2013.01); *H01L 29/7802* (2013.01); *H01L 51/0529* (2013.01)

(56) References Cited

U.S. PATENT DOCUMENTS

| | | | |
|---|---|---|---|
| 9,793,369 B2* | 10/2017 | Oka | H01L 29/518 |
| 9,893,180 B2* | 2/2018 | Mitani | H01L 29/41766 |
| 2013/0248981 A1* | 9/2013 | Okumura | H01L 29/7802 |
| | | | 257/329 |
| 2015/0236151 A1* | 8/2015 | McMahon | H01L 29/401 |
| | | | 257/77 |
| 2016/0087064 A1* | 3/2016 | Ohashi | H01L 29/1608 |
| | | | 257/77 |
| 2018/0130912 A1* | 5/2018 | Tateno | H01L 29/42384 |

\* cited by examiner

GATE INSULATING LAYER HAVING A PLURALITY OF SILICON OXIDE LAYER WITH VARYING THICKNESS

CROSS-REFERENCE TO RELATED APPLICATION

This application is based upon and claims the benefit of priority from Japanese Patent Application No. 2019-049192, filed on Mar. 15, 2019, the entire contents of which are incorporated herein by reference.

FIELD

Embodiments described herein relate generally to a semiconductor device.

BACKGROUND

Silicon carbide (SiC) is expected as a material for the next-generation semiconductor devices. Silicon carbide has better physical properties than silicon (Si). For example, the bandgap of the silicon carbide is three times wider than that of silicon, the breakdown field strength of the silicon carbide is about ten times higher than that of silicon, and the thermal conductivity of the silicon carbide is about three times higher than that of silicon. The use of the physical properties makes it possible to achieve a semiconductor device that has low loss and can operate at a high temperature.

For example, in case in which a metal oxide semiconductor field effect transistor (MOSFET) is formed using silicon carbide, there is a problem that the electric field concentrates on an end portion of a gate electrode and the amount of gate leak current increases.

DETAILED DESCRIPTION

Figure 1:
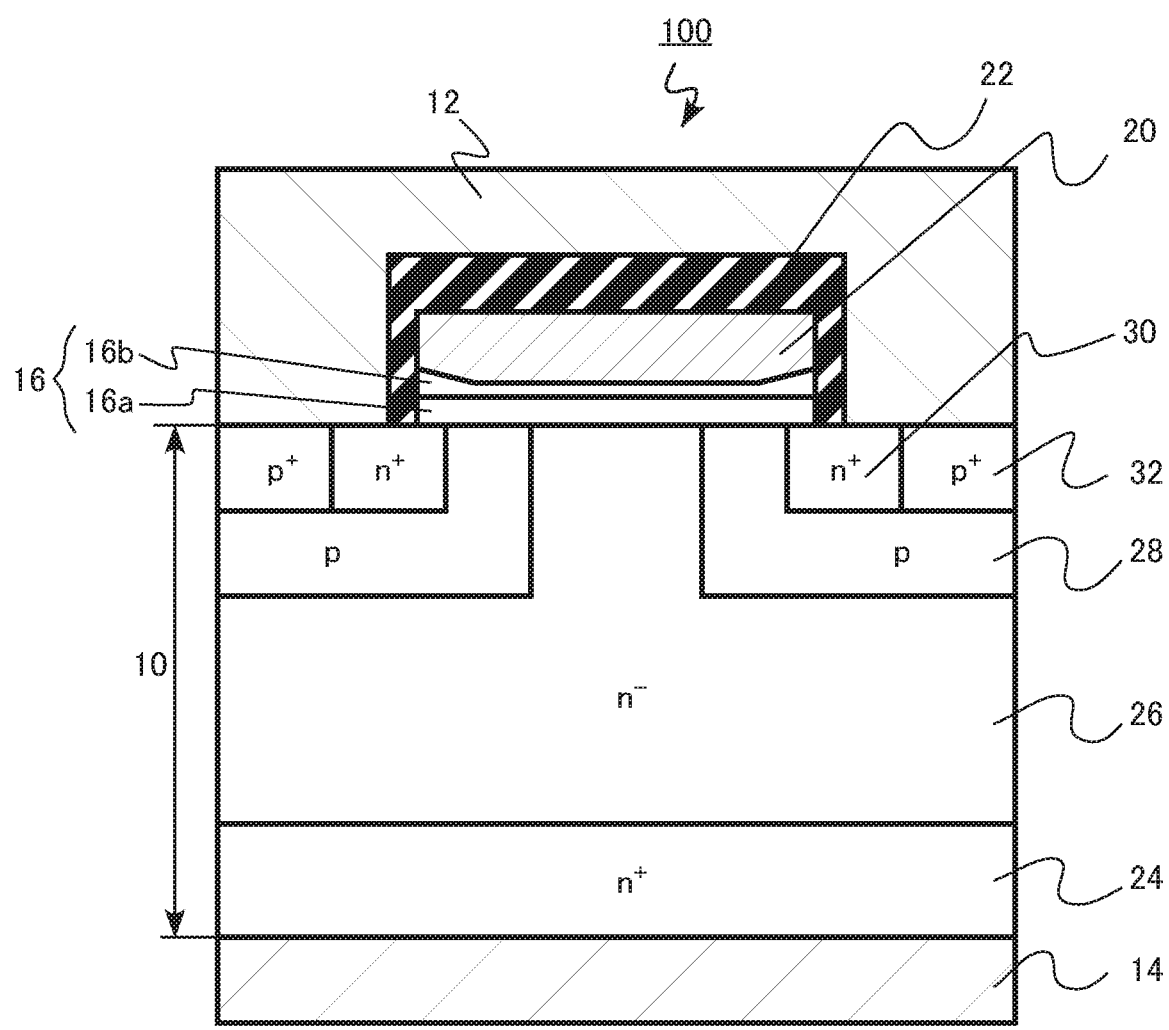
FIG. 1 is a cross-sectional view schematically illustrating a semiconductor device according to an embodiment.

A semiconductor device according to an embodiment includes: a silicon carbide layer; a gate electrode; and a gate insulating layer provided between the silicon carbide layer and the gate electrode, the gate insulating layer including a first silicon oxide layer and a second silicon oxide layer, the second silicon oxide layer being provided between the first silicon oxide layer and the gate electrode, the first silicon oxide layer having a first nitrogen concentration and a first thickness, the second silicon oxide layer having a second nitrogen concentration lower than the first nitrogen concentration and a second thickness. The second thickness between an end portion of the gate electrode and the silicon carbide layer is greater than the second thickness between a central portion of the gate electrode and the silicon carbide layer.

Hereinafter, an embodiment of the invention will be described with reference to the drawings. In the following description, in some cases, the same or similar members are denoted by the same reference numerals and the description of, for example, the member which has been described once will not be repeated.

In the specification, in some cases, the term "upper side" or "lowerside" is sued for convenience. The "upper side" or the "lower side" is a term indicating the relative positional relationship in the drawings and is not a term defining the positional relationship with respect to the direction of gravity.

In the following description, in a case in which the notation of $n^+$, n, $n^-$, $p^+$, p, and $p^-$ is used, this notation indicates the relative impurity concentration levels of each conductivity type. That is, $n^+$ indicates a higher n-type impurity concentration than n and $n^-$ indicates a lower n-type impurity concentration than n. In addition, $p^+$ indicates a higher p-type impurity concentration than p and $p^-$ indicates a lower p-type impurity concentration than p. In some cases, an $n^+$ type and an $n^-$ type are simply referred to as an n type and a $p^+$ type and a $p^-$ type are simply referred to as a p type.

Qualitative analysis and quantitative analysis for the chemical composition of members forming the semiconductor device described in the specification can be performed by, for example, secondary ion mass spectrometry (SIMS), energy dispersive X-ray spectroscopy (EDX), and a three-dimensional atom probe. In addition, for example, a transmission electron microscope (TEM) can be used to measure the thickness of the members forming the semiconductor device and the distance between the members. Further, for example, the three-dimensional atom probe can be used to measure the magnitude relationship between the thicknesses of the members forming the semiconductor device.

A semiconductor device according to an embodiment includes: a silicon carbide layer; a gate electrode; and a gate insulating layer provided between the silicon carbide layer and the gate electrode, the gate insulating layer including a first silicon oxide layer and a second silicon oxide layer, the second silicon oxide layer being provided between the first silicon oxide layer and the gate electrode, the first silicon oxide layer having a first nitrogen concentration and a first thickness, the second silicon oxide layer having a second nitrogen concentration lower than the first nitrogen concentration and a second thickness. The second thickness between an end portion of the gate electrode and the silicon carbide layer is greater than the second thickness between a central portion of the gate electrode and the silicon carbide layer.

Hereinafter, a case in which a first conductivity type is an n type and a second conductivity type is a p type will be described as an example.

FIG. 1 is a cross-sectional view schematically illustrating the semiconductor device according to the embodiment. The semiconductor device according to the embodiment is a MOSFET 100. The MOSFET 100 is a double implantation MOSFET (DIMOSFET) in which a p well and a source region are formed by ion implantation. In addition, the MOSFET 100 is an n-channel vertical MOSFET having electrons as carriers.

The MOSFET 100 includes a silicon carbide layer 10, a source electrode 12 (first electrode), a drain electrode 14 (second electrode), a gate insulating layer 16, a gate electrode 20, and an interlayer insulating film 22. The silicon carbide layer 10 includes a drain region 24, a drift region 26 (first silicon carbide region), a p well region 28 (second silicon carbide region), a source region 30 (third silicon carbide region), and a p well contact region 32. The gate insulating layer 16 includes a first silicon oxide layer 16a and a second silicon oxide layer 16b.

The silicon carbide layer 10 is made of, for example, single-crystal silicon carbide. The silicon carbide layer 10 is made of, for example, 4H—SiC.

The drain region 24 is an n⁺ silicon carbide region. The drain region 24 includes, for example, nitrogen as n-type impurities.

The drift region 26 is an n silicon carbide region. The drift region 26 is provided between the drain region 24 and the gate electrode 20. The drift region 26 includes, for example, nitrogen as n-type impurities. At least a portion of the drift region 26 comes into contact with the gate insulating layer 16.

The p well region 28 is a p-type silicon carbide region. The p well region 28 is provided between the drift region 26 and the gate electrode 20. The p well region 28 includes, for example, aluminum (Al) as p-type impurities. At least a portion of the p well region 28 comes into contact with the gate insulating layer 16. The p well region 28 functions as a channel region of the MOSFET 100.

The source region 30 is an n⁺ silicon carbide region. The source region 30 is provided between the p well region 28 and the gate electrode 20. The source region 30 includes, for example, phosphorus (P) as n-type impurities. At least a portion of the source region 30 comes into contact with the gate insulating layer 16.

The p well contact region 32 is a p⁺ silicon carbide region. The p well contact region 32 is provided between the p well region 28 and the source electrode 12.

Figure 2:
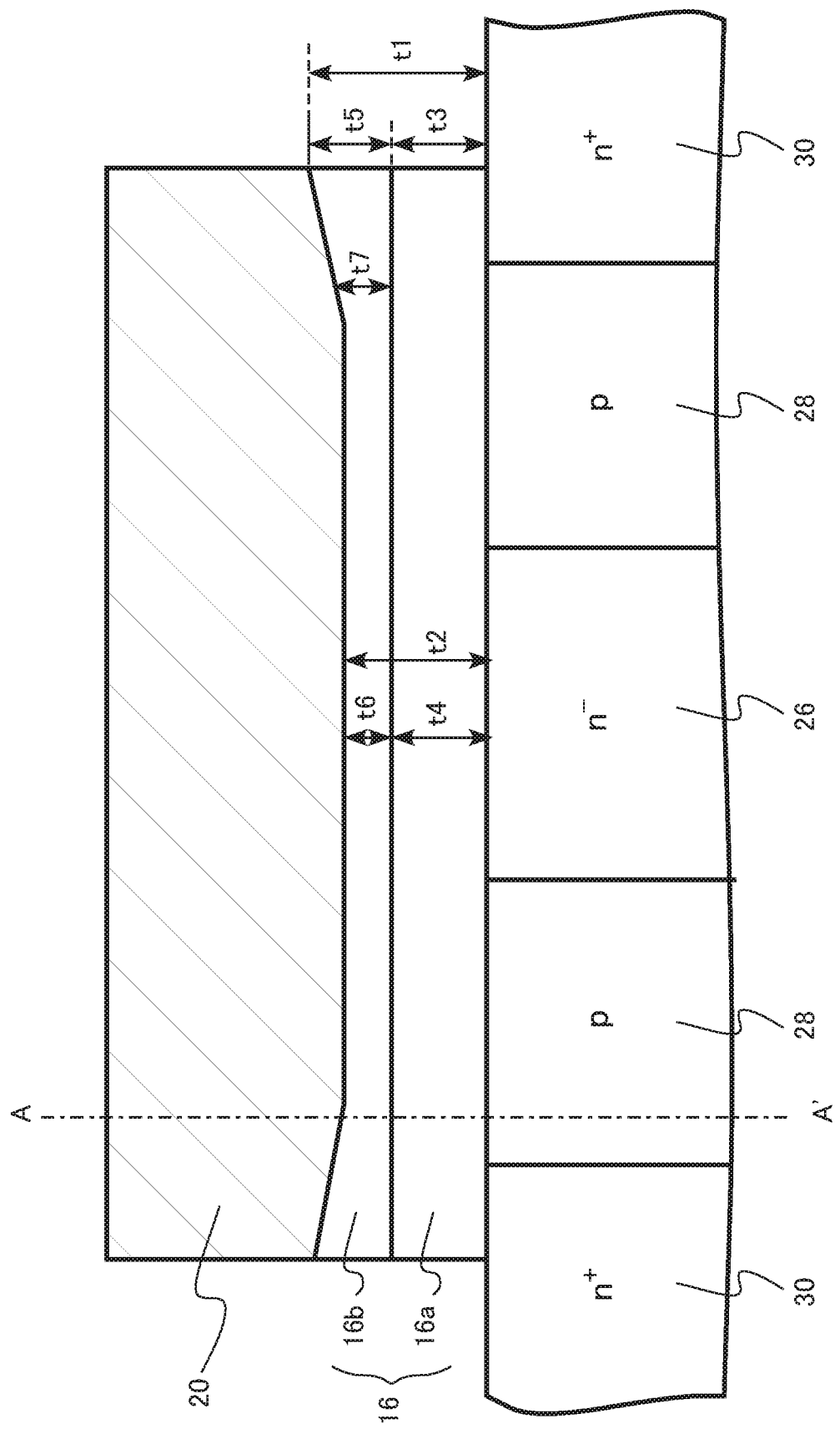
FIG. 2 is a cross-sectional view schematically illustrating a portion of the semiconductor device according to the embodiment.

FIG. 2 is a cross-sectional view schematically illustrating a portion of the semiconductor device according to the embodiment. FIG. 2 illustrates the cross section of a portion of the silicon carbide layer 10, the gate insulating layer 16, and the gate electrode 20.

The gate electrode 20 is provided on the gate insulating layer 16. The gate electrode 20 includes, for example, polycrystalline silicon.

The polycrystalline silicon of the gate electrode 20 includes n-type impurities or p-type impurities. The polycrystalline silicon of the gate electrode 20 includes, for example, at least one impurity element selected from the group consisting of boron (B), phosphorus (P), and arsenic (As). Hereinafter, a case in which the gate electrode 20 is made of polycrystalline silicon including boron (B) will be described as an example.

The gate insulating layer 16 is provided between the silicon carbide layer 10 and the gate electrode 20. The gate insulating layer 16 includes the first silicon oxide layer 16a and the second silicon oxide layer 16b.

The thickness (t1 in FIG. 2) of the gate insulating layer 16 between an end portion of the gate electrode 20 and the silicon carbide layer 10 is greater than the thickness (t2 in FIG. 2) of the gate insulating layer 16 between a central portion of the gate electrode 20 and the silicon carbide layer 10. The thickness t1 is, for example, equal to or greater than 1.1 times the thickness t2 and equal to or less than 1.3 times the thickness t2.

The thickness of the gate insulating layer 16 is, for example, equal to or greater than 25 nm and equal to or less than 100 nm.

The first silicon oxide layer 16a comes into contact with the silicon carbide layer 10. The first silicon oxide layer 16a has a first nitrogen concentration and a first thickness.

The thickness (t3 in FIG. 2) of the first silicon oxide layer 16a between the end portion of the gate electrode 20 and the silicon carbide layer 10 is substantially equal to the thickness (t4 in FIG. 2) of the first silicon oxide layer 16a between the central portion of the gate electrode 20 and the silicon carbide layer 10.

The first thickness of the first silicon oxide layer 16a is, for example, equal to or greater than 20 nm and equal to or less 80 nm.

The first silicon oxide layer 16a includes silicon oxide as main component. The inclusion of silicon oxide as the main component means that the mole fraction of the silicon oxide is the highest in the material forming the first silicon oxide layer 16a. The mole fraction of the silicon oxide in the first silicon oxide layer 16a is, for example, equal to or greater than 90%.

The second silicon oxide layer 16b is provided between the first silicon oxide layer 16a and the gate electrode 20. The second silicon oxide layer 16b has a second nitrogen concentration and a second thickness. The second silicon oxide layer 16b comes into contact with the first silicon oxide layer 16a.

The second nitrogen concentration is lower than the first nitrogen concentration of the first silicon oxide layer 16a. The second thickness is less than the first thickness of the first silicon oxide layer 16a.

The second thickness (t5 in FIG. 2) between the end portion of the gate electrode 20 and the silicon carbide layer 10 is greater than the second thickness (t6 in FIG. 2) between the central portion of the gate electrode 20 and the silicon carbide layer 10. The second thickness (t5 in FIG. 2) between the gate electrode 20 and the source region 30 is greater than the second thickness (t6 in FIG. 2) between the gate electrode 20 and the drift region 26. In addition, for example, the second thickness (t7 in FIG. 2) of at least a portion between the gate electrode 20 and the p well region 28 is greater than the second thickness (t6 in FIG. 2) between the gate electrode 20 and the drift region 26.

The second thickness of the second silicon oxide layer 16b is, for example, equal to or greater than 2 nm and equal to or less than 20 nm. The second thickness (t6 in FIG. 2) between the central portion of the gate electrode 20 and the silicon carbide layer 10 may be zero.

The ratio of the second thickness to the first thickness in the end portion of the gate electrode 20 (second thickness/first thickness) is greater than the ratio of the second thickness to the first thickness in the central portion of the gate electrode 20 (second thickness/first thickness). That is, t5/t3 is greater than t6/t4.

The second silicon oxide layer 16b includes silicon oxide as a main component. The inclusion of silicon oxide as the main component means that the mole fraction of the silicon oxide is the highest in the material forming the second silicon oxide layer 16b. The mole fraction of the silicon oxide in the second silicon oxide layer 16b is, for example, equal to or greater than 90%.

Figure 3A:
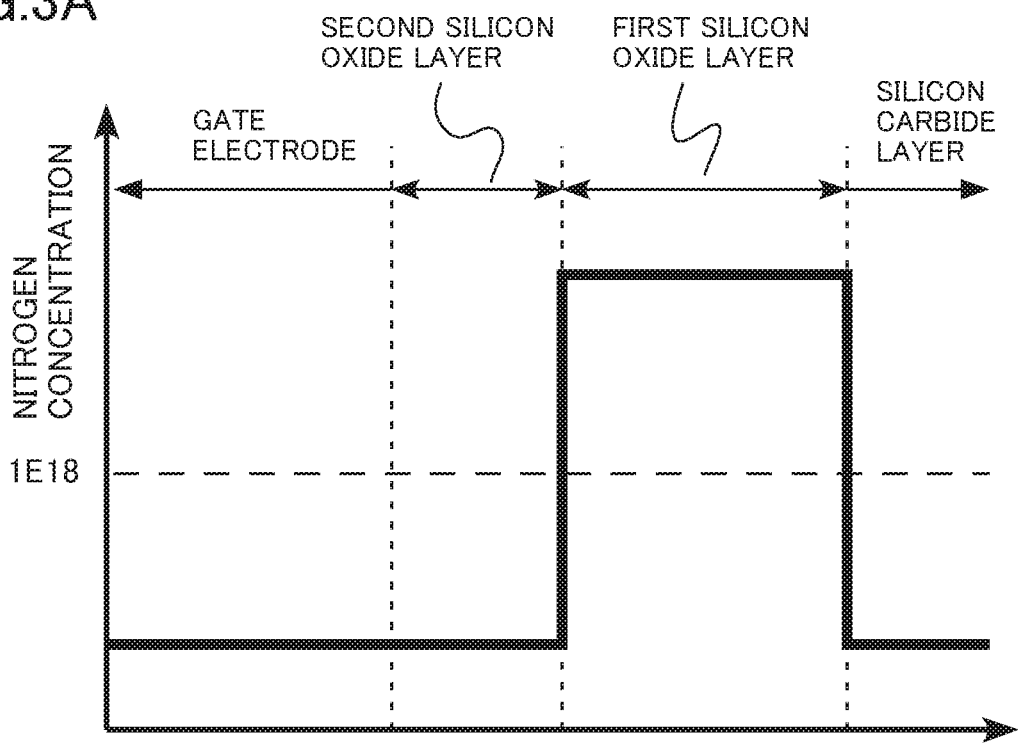
FIGS. 3A and 3B are conceptual diagrams illustrating the impurity concentration distributions of the semiconductor device according to the embodiment.
Figure 3B:
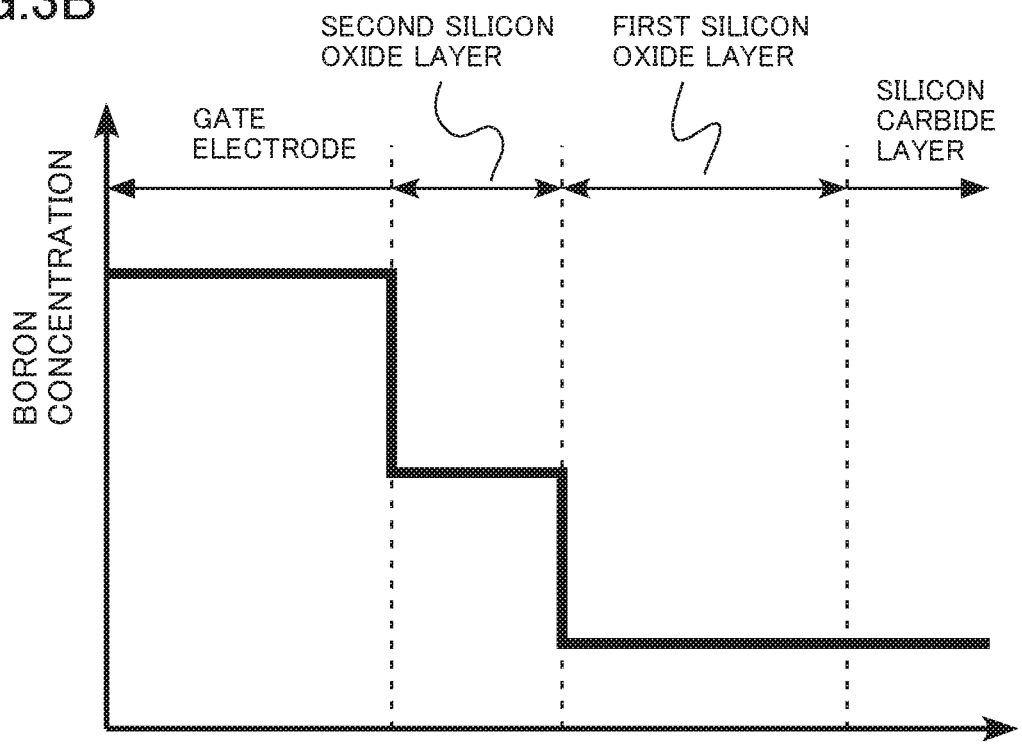

FIGS. 3A and 3B are conceptual diagrams illustrating the impurity concentration distributions of the semiconductor device according to the embodiment. FIGS. 3A and 3B illustrate, for example, the impurity concentration distributions taken along the line AA' of FIG. 2. FIG. 3A illustrates the distribution of nitrogen (N) and FIG. 3B illustrates the distribution of boron (B).

As illustrated in FIG. 3A, the second nitrogen concentration of the second silicon oxide layer 16b is lower than the first nitrogen concentration of the first silicon oxide layer 16a. The first nitrogen concentration is, for example, equal to or greater than $1 \times 10^{18}$ cm$^{-3}$ and equal to or less than $1 \times 10^{20}$ cm$^{-3}$. The second nitrogen concentration is, for example, less than $1\times10^{18}$ cm$^{-3}$. The second nitrogen concentration is, for example, one digit or more lower than the first nitrogen concentration.

As illustrated in FIG. 3B, the boron concentration of the first silicon oxide layer 16*a* is lower than the boron concentration of the second silicon oxide layer 16*b*.

Nitrogen (N) forms an interface termination structure at the interface between the silicon carbide layer 10 and the gate insulating layer 16. A dangling bond at the interface between the silicon carbide layer 10 and the gate insulating layer 16 is terminated by nitrogen (N). Nitrogen (N) is a so-called termination element.

The interlayer insulating film 22 is formed on the gate electrode 20. The interlayer insulating film 22 is, for example, a silicon oxide film.

The source electrode 12 is electrically connected to the source region 30 and the p well contact region 32. The source electrode 12 also functions as a p well electrode that applies potential to the p well region 28.

The source electrode 12 is made of, for example, metal. The source electrode 12 has a stacked structure of, for example, a barrier metal layer which is made of nickel (Ni) and a metal layer which is made of aluminum and is provided on the barrier metal layer.

The drain electrode 14 is electrically connected to the drain region 24. The drain electrode 14 is made of, for example, metal. The drain electrode 14 is made of, for example, nickel. Next, an example of a method for manufacturing the semiconductor device according to the embodiment will be described.

First, a silicon carbide substrate which becomes the n$^+$ drain region 24 is prepared. The silicon carbide substrate is made of, for example, 4H—SiC.

Then, the n$^-$ drift region 26 is formed on the silicon carbide substrate by an epitaxial growth method. The thickness of the drift region 26 is, for example, equal to or greater than 5 μm and equal to or less than 100 μm.

Then, the p well region 28, the n$^+$ source region 30, and the p well contact region 32 of a p$^+$ type are formed by a photolithography method and an ion implantation method.

Then, a silicon oxide film is formed on the silicon carbide layer 10. The silicon oxide film is formed by, for example, a chemical vapor deposition method. A portion of the silicon oxide film finally becomes the first silicon oxide layer 16*a*.

Then, a heat treatment performed in a nitrogen oxide gas atmosphere. In a case in which the heat treatment is performed in the nitrogen oxide gas atmosphere, a dangling bond at the interface between the silicon carbide layer 10 and the silicon oxide film is terminated by nitrogen (N). The nitrogen oxide gas is, for example, nitrous oxide (N$_2$O) gas or nitrogen monoxide (NO) gas.

Then, a polycrystalline silicon film including boron is formed on the silicon oxide film. A portion of the polycrystalline silicon film finally becomes the gate electrode 20.

Then, the polycrystalline silicon film is patterned by a photolithography method or a reactive ion etching method (RIE method).

Then, a heat treatment is performed in an oxidizing atmosphere. The polycrystalline silicon film is oxidized by the heat treatment. At that time, oxidation also proceeds from a lower surface of the polycrystalline silicon film, that is, a surface of the polycrystalline silicon film which comes into contact with the silicon oxide film. The second silicon oxide layer 16*b* is formed by the oxidation of the polycrystalline silicon film.

Since oxidation also proceeds from a side surface of the polycrystalline silicon film, the thickness of the second silicon oxide layer 16*b* is large in an end portion of the lower surface of the polycrystalline silicon film. The heat treatment for oxidizing the polycrystalline silicon film is performed by, for example, dry oxidation at a temperature of 850° C.

Boron (B) included in the polycrystalline silicon film is diffused to the second silicon oxide layer 16*b*.

Then, a silicon oxide film which becomes the interlayer insulating film 22 is formed on the oxidized polycrystalline silicon film by a CVD method.

Then, the source electrode 12 is formed on the upper surface of the silicon carbide layer 10 and the drain electrode 14 is formed on the lower surface of the silicon carbide layer 10. In this way, the MOSFET 100 illustrated in FIG. 1 is formed.

Next, the function and effect of the semiconductor device according to the embodiment will be described.

In a case in which the MOSFET is formed using silicon carbide, there is a problem that the mobility of carriers is reduced. It is considered that one of the causes of the reduction in the mobility of carriers is an interface state between the silicon carbide layer and the gate insulating layer. For example, there is a method which performs a heat treatment in a nitrogen oxide gas atmosphere to reduce the interface state after forming a gate insulating layer. In a case in which the heat treatment is performed in the nitrogen oxide gas atmosphere, a dangling bond at the interface between the silicon carbide layer and the gate insulating layer is terminated by nitrogen (N). Therefore, the interface state is reduced.

However, in a case in which this method is used, nitrogen remains in the gate insulating layer. The remaining nitrogen forms a trap state in the gate insulating layer. In a case in which a MOSFET turn-on voltage is applied to the gate electrode, a large amount of gate leak current flows between the gate electrode and the silicon carbide layer through the trap state, which causes a problem. In particular, since the electric field concentrates on the end portion of the gate electrode, the amount of gate leak current in the end portion of the gate electrode is large. In a case in which the amount of gate leak current is large, for example, there is a problem that an error in the operation of the MOSFET occurs or power consumption increases.

In the MOSFET 100 according to the embodiment, the gate insulating layer 16 includes the second silicon oxide layer 16*b* with low nitrogen concentration. Therefore, the trap state of the gate insulating layer 16 is reduced and the amount of gate leak current is reduced. In addition, since the thickness of the gate insulating layer 16 in the end portion of the gate electrode 20 is large, the concentration of the electric field on the end portion of the gate electrode 20 is reduced. Therefore, the amount of gate leak current is further reduced.

In addition, the thickness of the gate insulating layer 16 in the end portion of the gate electrode 20 is increased by increasing the thickness of the second silicon oxide layer 16*b* with low nitrogen concentration. Therefore, in the gate insulating layer 16 in the end portion of the gate electrode 20, trap state density is further reduced and the amount of gate leak current is further reduced.

Furthermore, since the electric field concentrates on the end portion of the gate electrode, the number of charge traps to the trap state in the gate insulating layer 16 also increases. In a case in which the charge trap occurs in the gate insulating layer 16, for example, the threshold voltage of the MOSFET varies, which causes a problem.

In the MOSFET 100 according to the embodiment, since the thickness of the gate insulating layer 16 in the end portion of the gate electrode 20 is large, the electric field in the end portion of the gate electrode 20 is reduced and the number of charge traps is reduced. Therefore, the thickness of the second silicon oxide layer 16b with low nitrogen concentration is increased to increase the thickness of the gate insulating layer 16 in the end portion of the gate electrode 20. Therefore, in the gate insulating layer 16 in the end portion of the gate electrode 20, the number of charge traps is further reduced and a variation in the threshold voltage of the MOSFET is suppressed.

Further, in the MOSFET 100 according to the embodiment, the thickness of the gate insulating layer 16 in the end portion of the gate electrode 20 is increased to reduce the concentration of the electric field on the end portion of the gate electrode 20 and to improve the breakdown tolerance of the gate insulating layer 16.

It is preferable that the thickness (t1 in FIG. 2) of the gate insulating layer 16 between the end portion of the gate electrode 20 and the silicon carbide layer 10 is equal to or greater than 1.1 times the thickness (t2 in FIG. 2) of the gate insulating layer 16 between the central portion of the gate electrode 20 and the silicon carbide layer 10 and equal to or less than 1.3 times the thickness. In a case in which the thickness is equal to or greater than the lower limit, the effect of reducing the concentration of the electric field on the end portion of the gate electrode 20 increases. In addition, in a case in which the thickness is equal to or less than the upper limit, it is easy to manufacture the MOSFET.

The first nitrogen concentration of the first silicon oxide layer 16a is preferably equal to or greater than $1 \times 10^{18}$ cm$^{-3}$ and more preferably equal to or greater than $1 \times 10^{19}$ cm$^{-3}$ in order to reduce the interface state between the silicon carbide layer 10 and the gate insulating layer 16. The second nitrogen concentration of the second silicon oxide layer 16b is preferably less than $1 \times 10^{18}$ cm$^{-3}$ and more preferably less than $1 \times 10^{17}$ cm$^{-3}$ in order to reduce the trap state.

It is preferable that the second thickness (t7 in FIG. 2) of at least a portion between the gate electrode 20 and the p well region 28 is greater than the second thickness (t6 in FIG. 2) between the gate electrode 20 and the drift region 26 in order to suppress the charge trap immediately above the channel region and to suppress a variation in the threshold voltage.

It is preferable that the polycrystalline silicon of the gate electrode 20 includes boron (B). In a case in which boron (B) is included, the oxidation of polycrystalline silicon is accelerated. Therefore, it is easy to increase the thickness of the second silicon oxide layer 16b in the end portion of the gate electrode 20.

It is preferable that the boron concentration of the first silicon oxide layer 16a is lower than the boron concentration of the second silicon oxide layer 16b. Boron is diffused to the silicon carbide layer 10 to suppress a variation in the threshold voltage of the MOSFET 100.

As described above, according to the embodiment, it is possible to achieve a semiconductor device with a small amount of gate leak current. In addition, it is possible to achieve a semiconductor device in which a variation in threshold voltage is suppressed. Further, it is possible to achieve a semiconductor device in which the breakdown tolerance of a gate insulating layer is improved.

As described above, in the embodiment, the case in which 4H—SiC is used as the crystal structure of silicon carbide has been described as an example. However, the embodiment of the invention may be applied to silicon carbide with other crystal structures, such as 6H—SiC and 3C—SiC.

In the embodiment, the case in which the first conductivity type is an n-type and the second conductivity type is a p type has been described as an example. However, the first conductivity type may be a p type and the second conductivity type may be an n type. In this case in which the MOSFET has holes as carriers.

In the embodiment, the vertical MOSFET has been described as an example. However, for example, the embodiment of the invention may also be applied to a horizontal MOSFET.

In the embodiment, the MOSFET has been described as an example. However, for example, the embodiment of the invention may also be applied to an insulated gate bipolar transistor (IGBT).

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer;
   a gate electrode; and
   a gate insulating layer provided between the silicon carbide layer and the gate electrode, the gate insulating layer including a first silicon oxide layer and a second silicon oxide layer, the second silicon oxide layer being provided between the first silicon oxide layer and the gate electrode, the first silicon oxide layer having a first nitrogen concentration and a first thickness, the second silicon oxide layer having a second nitrogen concentration lower than the first nitrogen concentration and a second thickness,
   wherein the second thickness between an end portion of the gate electrode and the silicon carbide layer is greater than the second thickness between a central portion of the gate electrode and the silicon carbide layer.

2. The semiconductor device according to claim 1,
   wherein a thickness of the gate insulating layer between the end portion of the gate electrode and the silicon carbide layer is greater than a thickness of the gate insulating layer between the central portion of the gate electrode and the silicon carbide layer.

3. The semiconductor device according to claim 2,
   wherein the second thickness is less than the first thickness.

4. The semiconductor device according to claim 2,
   wherein the first nitrogen concentration is equal to or greater than $1 \times 10^{18}$ cm$^{-3}$ and the second nitrogen concentration is less than $1 \times 10^{18}$ cm$^{-3}$.

5. The semiconductor device according to claim 1,
   wherein the second thickness is less than the first thickness.

6. The semiconductor device according to claim 1,
   wherein the first nitrogen concentration is equal to or greater than $1 \times 10^{18}$ cm$^{-3}$ and the second nitrogen concentration is less than $1 \times 10^{18}$ cm$^{-3}$.

7. The semiconductor device according to claim 1,
   wherein the gate electrode includes polycrystalline silicon, and the polycrystalline silicon includes at least one impurity element selected from the group consisting of boron (B), phosphorus (P), and arsenic (As).

8. The semiconductor device according to claim 7, wherein a concentration of the impurity element in the first silicon oxide layer is lower than a concentration of the impurity element in the second silicon oxide layer.

9. The semiconductor device according to claim 1, wherein the first thickness is equal to or greater than 20 nm and equal to or less than 80 nm, and the second thickness is equal to or greater than 2 nm and equal to or less than 20 nm.

10. The semiconductor device according to claim 1, further comprising:
    a first electrode; and
    a second electrode facing the first electrode with the silicon carbide layer interposed therebetween,
    wherein the silicon carbide layer includes:
    a first silicon carbide region of first-conductivity-type provided between the second electrode and the gate electrode, at least a portion of the first silicon carbide region contacting with the gate insulating layer;
    a second silicon carbide region of second-conductivity-type provided between the first silicon carbide region and the gate electrode, at least a portion of the second silicon carbide region contacting the gate insulating layer; and
    a third silicon carbide region of first-conductivity-type provided between the second silicon carbide region and the gate electrode, at least a portion of the third silicon carbide region contacting the gate insulating layer, and
    the second thickness between the gate electrode and the third silicon carbide region is greater than the second thickness between the gate electrode and the first silicon carbide region.

11. The semiconductor device according to claim 10, wherein the second thickness between the gate electrode and the second silicon carbide region is greater than the second thickness between the gate electrode and the first silicon carbide region.

* * * * *